(12) United States Patent
Nam

(10) Patent No.: US 6,291,251 B1
(45) Date of Patent: Sep. 18, 2001

(54) METHOD FOR FABRICATING FERROELECTRIC MEMORY

(75) Inventor: Hyo Jin Nam, Daejeon-shi (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/588,382

(22) Filed: Jun. 7, 2000

(30) Foreign Application Priority Data

Jun. 10, 1999 (KR) .................................................. 99-21595

(51) Int. Cl.[7] .................................................. H01G 7/06
(52) U.S. Cl. ........................ 438/3; 438/240; 438/945
(58) Field of Search ............................... 438/3, 240, 785, 438/945, 253–256, 396–399

(56) References Cited

U.S. PATENT DOCUMENTS 5,989,927 * 11/1999 Yamanobe ................. 438/3
6,114,228 * 9/2000 Gardner et al. ............. 438/3

* cited by examiner

Primary Examiner—Jey Tsai
(74) Attorney, Agent, or Firm—Fleshner & Kim, LLP

(57) ABSTRACT

Method for fabricating a nonvolatile ferroelectric memory, including the steps of (1) forming an insulating layer, a semiconductor layer, an etch stop layer, a lower electrode, a ferroelectric layer, and an upper electrode on a substrate in succession, (2) forming an etch mask pattern of a required form on the upper electrode, (3) using the etch mask pattern as a mask in subjecting the upper electrode, the ferroelectric layer, the lower electrode, the etch stop layer, the semiconductor layer, and the insulating layer to en bloc etching, to expose the substrate, and (4) removing the etch mask pattern, and forming source/drain regions in the exposed substrate, whereby providing a simple fabrication process and permitting to minimize an alignment allowance.

26 Claims, 7 Drawing Sheets

METHOD FOR FABRICATING FERROELECTRIC MEMORY

BACKGROUND OF THE INVENTION

1. Field of the Invention

The present invention relates to a method for fabricating a nonvolatile ferroelectric memory.

2. Background of the Related Art

FeRAM(Ferroelectric Random Access Memory) of a ferroelectric film has been widely studied as a memory which can replace nonvolatile memories, such as current flash memory, because, in general, the FeRAM not only has advantages of a fast writing speed, a low voltage driving, and a low power consumption, but also has a nonvolatile characteristic. In the current ferroelectric memories, there are ones with pairs of transistor and capacitor(1 transistor/1 capacitor type, 2 transistor/2 capacitor type), and ones with the ferroelectric film on a gate to form one transistor(1 transistor type). Researches for the ferroelectric memory is mostly focused on the 1 transistor/1 capacitor type.

In the meantime, recently a new type of SWL(Split Word Line) ferroelectric memory has been suggested, of which structure is as follows. FIG. 1A illustrates a circuit of a related art ferroelectric memory cell, and FIG. 1B illustrates a circuit of a related art SWL ferroelectric memory cell.

Referring to FIGS. 1A and 1B, though the SWL ferroelectric memory has no plateline of the related art ferroelectric memory, the SWL ferroelectric memory has the SWL adapted to serve as a wordline as well as a plateline of an adjacent cell. That is, different from the related art ferroelectric memory in which the platelines are electrically connected to a common line, since the SWL ferroelectric memory has the SWL, serving as the plateline, not connected in common, the SWL feitoelectric memory is operative at a fast speed, and prevents degradation of unselected cells during writing/reading operation of selected cells. As shown in FIG. 1B, the SWL ferroelectric memory has the wordline connected to a lower electrode of the capacitor in an adjacent cell, to form the SW1. wordline. Therefore, it is favorable that the ferroelectric capacitor is formed on the wordline for fabricating a ferroelectric memory with a high device packing density. In this instance, the wordline and the lower electrode is electrically connected either directly by a conducting barrier formed between the wordline and the lower electrode, or by a metal interconnection in a contact hole formed between the lower electrode and the wordline.

FIG. 2 illustrates a section of the SWL ferroelectric memory, of which fabrication process is similar to a fabrication process of the related art ferroelectric memory.

First, a gate oxide(SiO$_2$) layer and a polysilicon(Poly-Si) layer are formed over a substrate having a field oxide formed therein, and patterned, to form a wordline, and source/drain regions are formed on both sides of the wordline. Then, after an insulating layer is formed on an entire surface, a lower electrode, a ferroelectric layer, and an upper electrode are formed in succession on the insulating layer on the wordline, and patterned, to form a ferroelectric capacitor.

However, the related art method for fabricating the SWL ferroelectric memory has the following problem. The alignment allowance required between the wordline and the ferroelectric memory is not favorable for fabrication of a memory with a high device packing density and requires many fabrication process steps.

SUMMARY OF THE INVENTION

Accordingly, the present invention is directed to a method for fabricating a nonvolatile ferroelectric memory that substantially obviates one or more of the problems due to limitations and disadvantages of the related art.

An object of the present invention is to provide a method for fabricating a nonvolatile ferroelectric memory, which has a simple fabrication process and permits to minimize an alignment allowance.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for fabricating a nonvolatile ferroelectric memory, includes the steps of (1 ) forming an insulating layer, a semiconductor layer, an etch stop layer, a lower electrode, a ferroelectric layer, and an upper electrode on a substrate in succession, (2) forming an etch mask pattern of a required form on the upper electrode, (3) using the etch mask pattern as a mask in subjecting the upper electrode, the ferroelectric layer, the lower electrode, the etch stop layer, the semiconductor layer, and the insulating layer to en bloc etching, to expose the substrate, and (4) removing the etch mask pattern, and forming source/drain regions in the exposed substrate.

If the etch stop layer is formed of TiO$_2$, the etch mask is formed of Ti, and if the etch stop layer is formed of RuO$_2$, the etch mask is formed of Ru or Cr.

An etch gas for the etch mask of Ti is Cl$_2$/N$_2$, an etch gas for the etch mask of Ru or Cr is Cl$_2$/O$_2$, an etch gas for the etch stop layer of TiO$_2$ is C$_2$F$_6$(C$_3$F$_8$ or CHF$_3$)/Ar, and an etch gas for the etch stop layer of RuO$_2$ is Cl$_2$/O$_2$.

And, when the etch stop layer is formed of TiO$_2$, the upper electrode, the ferroelectric layer and the lower electrode arc en bloc etched by Cl$_2$/O$_2$ gas, and, when the etch stop layer is formed of RuO$_2$, the upper electrode, the ferroelectric layer, and the lower electrode are etched by Cl$_2$, Cl$_2$/CF$_4$, and Cl$_2$ gases, respectively.

The foregoing method for fabricating an SWL ferroelectric memory can simplify the fabrication process and minimize an alignment allowance, permitting to fabricate a memory with a high device packing density.

The introduction of the etch stop layer permits to prevent over etching of the wordline and the substrate.

And, the en bloc etching by using the etch stop layer and the metal mask is applicable to fabrication of the 1 transistor type ferroelectric memory of an MFMIS or MFIS structure with easy.

In other aspect of the present invention, there is provided a method for fabricating a nonvolatile ferroelectric memory, including the steps of (1) forming an etch stop layer, a ferroelectric layer, and an electrode layer on a substrate, (2) forming an etch mask pattern of a required form on the electrode layer, (3) using the etch mask pattern as a mask in subjecting the electrode layer, the ferroelectric layer, and the etch stop layer to en bloc etching, to expose the substrate, and (4) removing the etch mask pattern, and forming source/drain regions in the exposed substrate.

In this case too, if the etch stop layer is formed of TiO$_2$, the etch mask is formed of Ti, and, if the etch stop layer is formed of RuO$_2$, a gate oxide film is provided between the etch stop layer and the silicon, the etch mask is formed of Ru or Cr, and the same etch gas is used.

The foregoing method simplifies fabrication of an 1 transistor type ferroelectric memory of MFMIS or MFIS structure.

Since both the lower electrode and the etch stop layer are formed of $RuO_2$, and both the insulating layer and the etch stop layer are formed of $TiO_2$, over etching of the substrate can be prevented.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings. The present invention suggests a new method for supplementing the related art method for fabricating an SWL, ferroelectric memory, in which the lack of alignment allowance between the wordline and the SWL ferroelectric memory impedes fabrication of a memory with a high device packing density and requires many fabrication steps. A core of the present invention lies on employment of an etch stop layer and a metal mask of a high etch selectivity for etching a ferroelectric layer and a polysilicon layer at a time. FIGS. 3A–3G illustrate sections showing the steps of a method for fabricating an SWL ferroelectric memory in accordance with a preferred embodiment of the present invention.

Figure 1A:
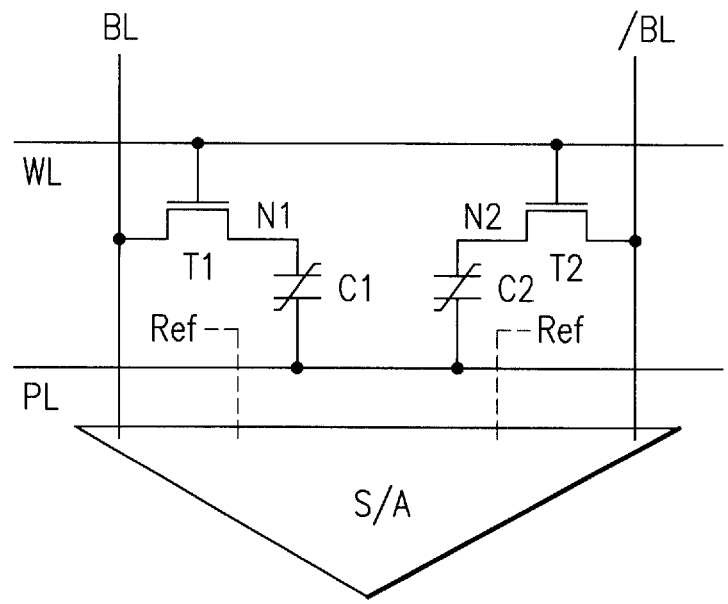
FIG. 1A illustrates a circuit of a related art ferroelectric memory cell.
Figure 1B:
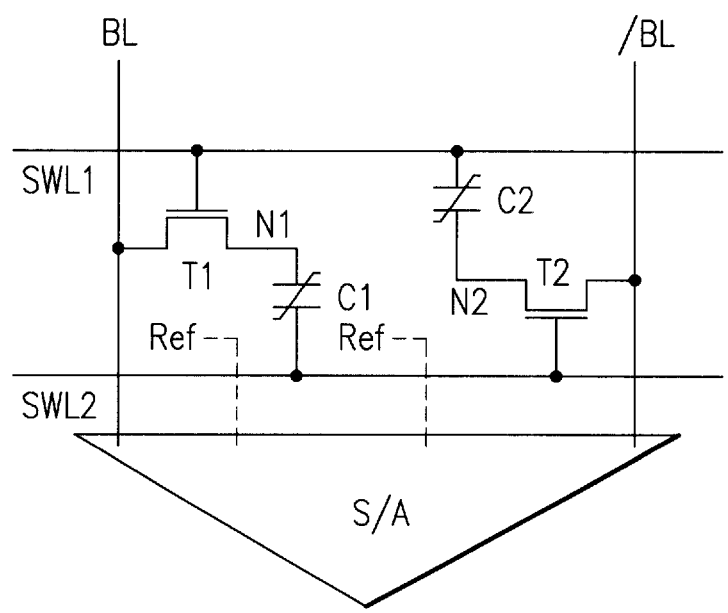
FIG. 1B illustrates a circuit of a related art SWL ferroelectric memory cell.
Figure 2:
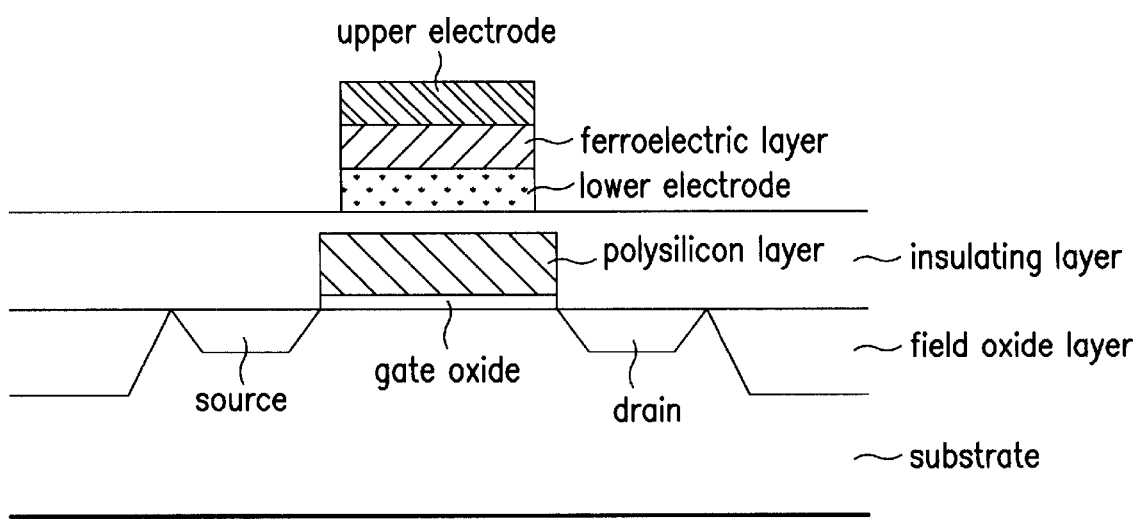
FIG. 2 illustrates a section of the SWL ferroelectric memory.
Figure 3A:
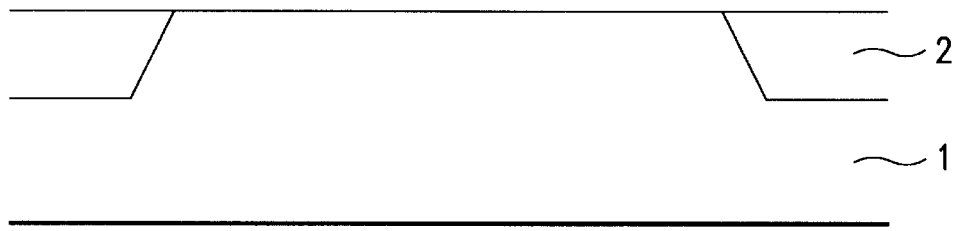
FIGS. 3A–3G illustrate sections showing the steps of a method for fabricating an SWL ferroelectric memory in accordance with a preferred embodiment of the present invention.
Figure 3B:
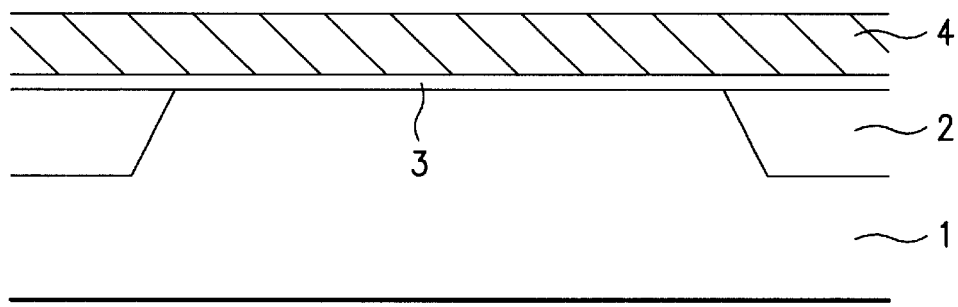
Figure 3C:
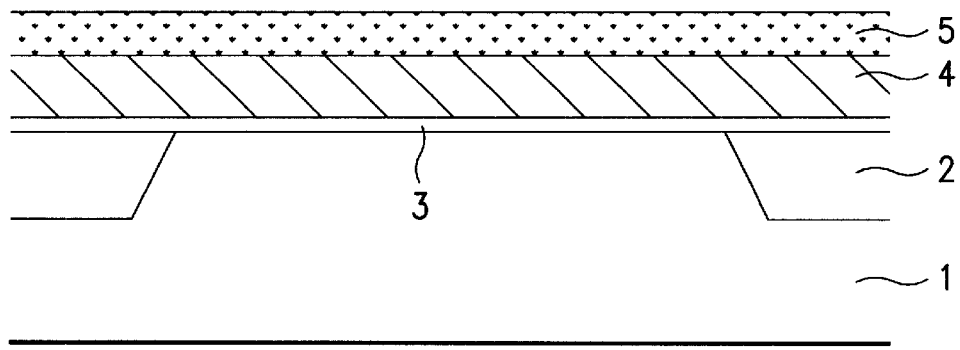
Figure 3D:
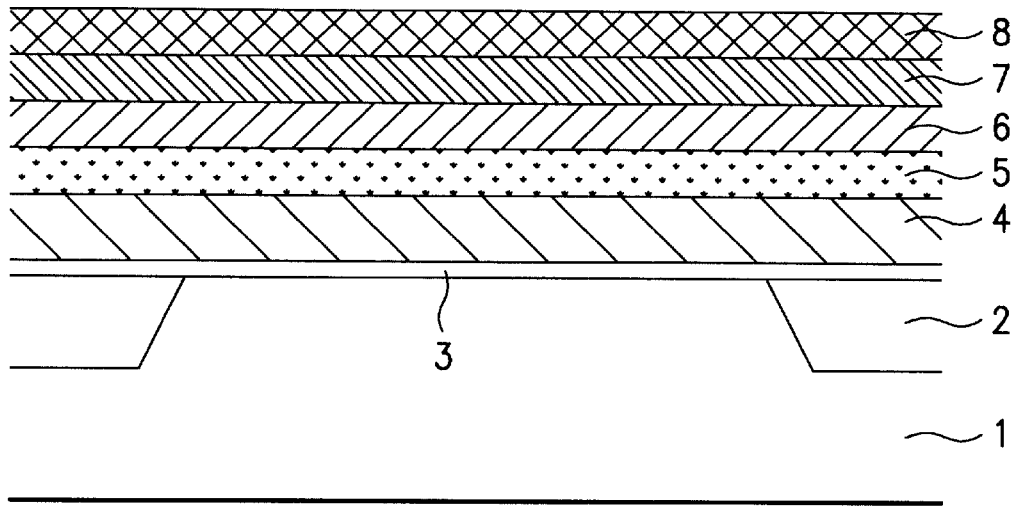
Figure 3E:
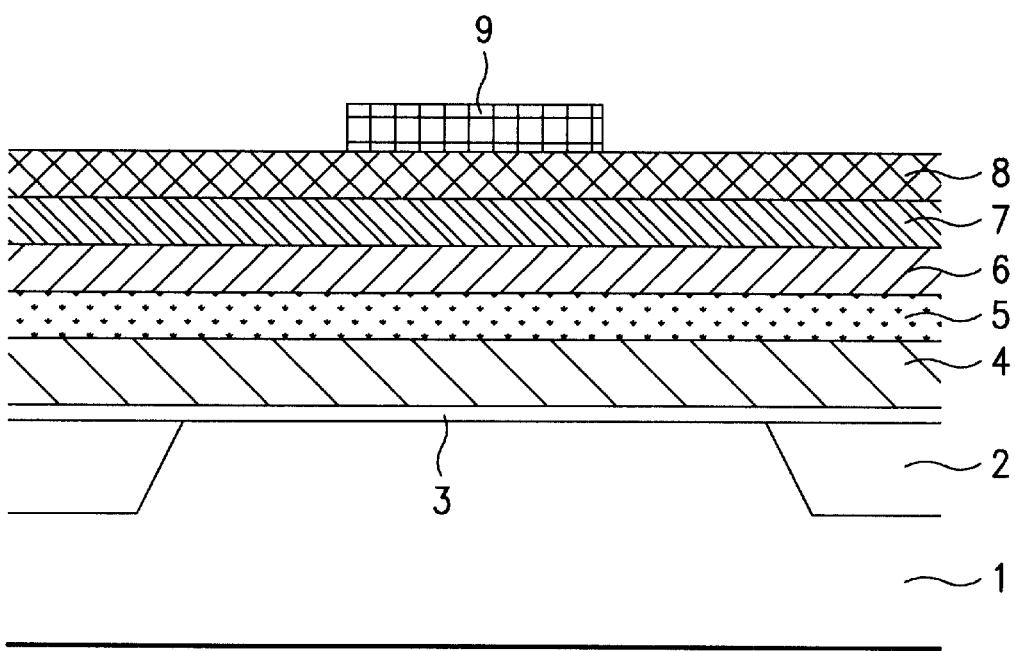
Figure 3F:
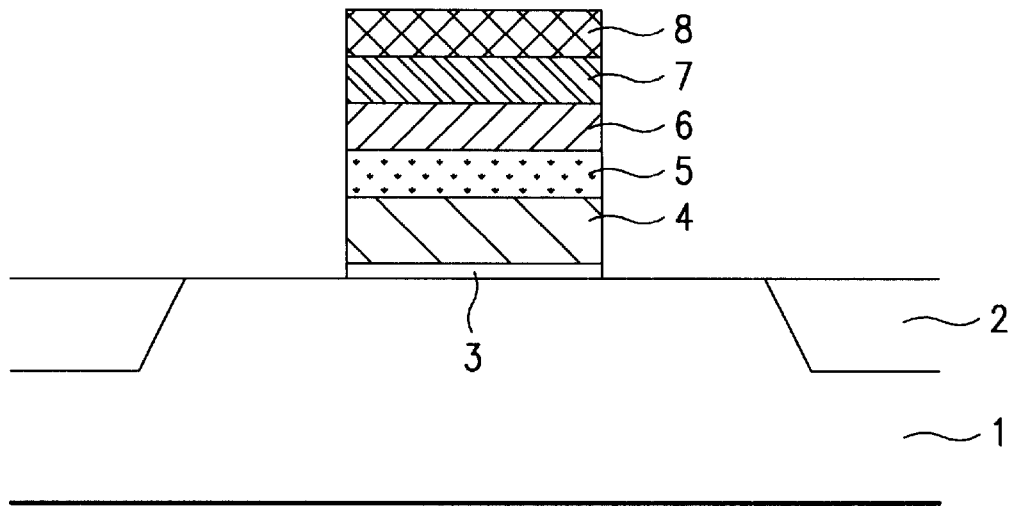

Referring to FIG. 3A, after field oxide($SiO_2$) 2 is formed in a substrate for isolation between cells, as shown in FIG. 3B, a gate oxide($SiO_2$) layer 3 is formed on the substrate, and a polysilicon layer 4, or a tungsten silicide layer is formed thereon. Then, as shown in FIG. 3C, an etch stop layer 5 of $TiO_2$, $RuO_2$, or a material including $TiO_2$, and/or $RuO_2$ is formed on the polysilicon layer 4 for prevention of diffusion between a ferroelectric capacitor to be formed later and the polysilicon layer 4 and etch stopping. And, in cases, other layers may be formed for prevention of formation of silicides and the like. Then, as shown in FIG. 3D, in order to form the ferroelectric capacitor, a lower electrode 6 of Pt/Ti, or $IrO_2$ and the like, a ferroelectric layer of PZT, or SBT, and an upper electrode 8 of Pt. $IrO_2$ are formed on the etch stop layer 5 in succession. As shown in FIG. 3E, a hard mask pattern 9 for use in etching is formed on the upper electrode, of any one selected from Ru, Cr, or Ti. In this instance, the etch stop layer is formed of $TiO_2$, when the hard mask is formed of Ti, and the etch stop layer is formed of $RuO_2$, when the hard mask is formed of Ru, or Cr. As shown in FIG. 3F, such a hard mask is used in etching the upper electrode 8, the ferroelectric layer 7, the lower electrode 6, the etch stop layer 5, the polysilicon layer 4, and the gate oxide layer 3 at a time(en bloc). An etch mask and an etch stop layer, each with a high etch selectivity are essential for etching such thick multiple layers.

The reason why the foregoing materials are selected for forming the etch mask and the etch stop layer and gases employed in the en bloc etching will be explained, in more detail. The following table 1 shows etch rates and etch selectivities of a Pt electrode and a PZT thin film.

TABLE 1

| etch mask | etch stop layer | etch gas | etch rate (Å/min) | etch selectivity | |
|---|---|---|---|---|---|
| Ru | $RuO_2$ | $Cl_2/CF_4$, $Cl_2$ | PZT:850 Pt:750 | PZT/Ru:3.4 Pt/Ru:3.9 | PZT/$RuO_2$:4 Pt/$RuO_2$:4.6 |
| Ti | $TiO_2$ | $Cl_2/O_2$ | PZT:200 Pt:80 | PZT/Ti:5.3 Pt/Ti:13.3 | PZT/$TiO_2$:8 Pt/$TiO_2$:20 |

The etching is carried out at etch conditions of a RIE power approx. 200 W, an ICP power approx. 700 W, and a pressure of approx. 10 mTorr. As can be seen in table 1, though a case when the etch mask is formed of Ru and the etch stop layer is formed of $RuO_2$ has etch rates of Pt and PzT higher than a case when the etch mask is formed of Ti and the etch stop layer is formed of $TiO_2$, the former case has an etch selectivity lower than the latter case. However, both cases show etch selectivity significantly higher than a case when the etch mask is formed of photoresist or silicon oxide ($SiO_2$). Table 2 below shows etch gases when the etch stop layer is formed of $RuO_2$ or $TiO_2$ in the en bloc etching.

TABLE 2

| Pt/PZT/Pt/Ti/$RuO_2$/Poly-Si/$SiO_2$ | | Pt/PZT/Pt/Ti/$TiO_2$/Poly-Si/$SiO_2$ | |
|---|---|---|---|
| etched material | etch gas | etched material | etch gas |
| Ti (etch mask for Ru) | $Cl_2/N_2$ | Ti (etch mask) | $Cl_2/N_2$ |
| Ru or Cr (etch mask) | $Cl_2/O_2$ | | |
| Pt | $Cl_2$ | Pt | $Cl_2/O_2$ |
| PZT | $Cl_2/CF_4$ | PZT | $Cl_2/O_2$ |
| Pt | $Cl_2$ | Pt | $Cl_2/O_2$ |
| $RuO_2$ | $Cl_2/O_2$ | $TiO_2$ | $C_2F_6$/Ar |
| Poly-Si | $Cl_2$ | Poly-Si | $Cl_2$ |
| $SiO_2$ | $C_3F_6$/Ar | $SiO_2$ | $C_2F_6$/Ar |

Figure 3G:
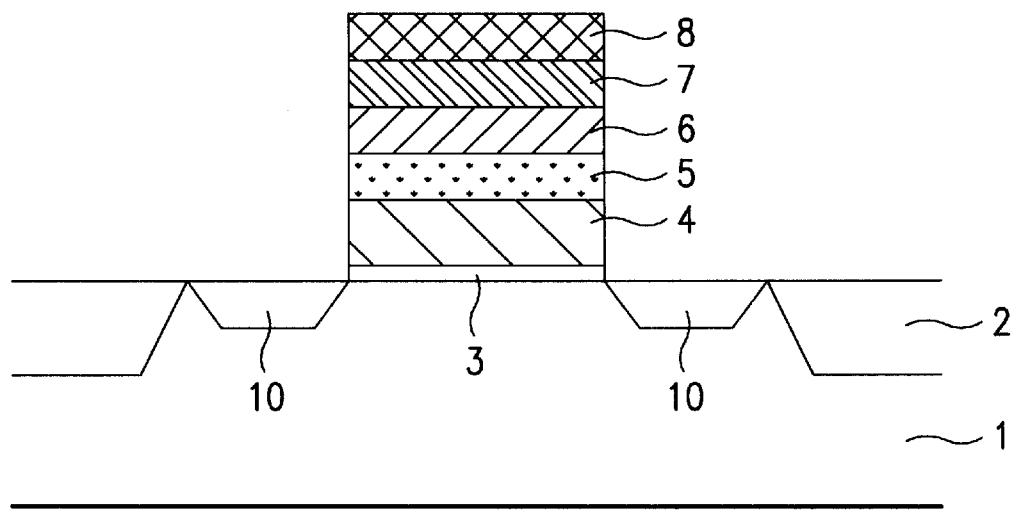

As can be seen in table 2, when the etch stop layer is formed of $RuO_2$, the etch mask is formed of Ru or Cr which is etched by using $Cl_2/O_2$ gas. And, Ru or Cr is etched by using an etch mask of Ti. And, the upper Pt and PZT, and the lower Pt are etched by $Cl_2$, $Cl_2/CF_4$, and $Cl_2$, respectively. In this instance, since the etch stop layer of $RuO_2$ is almost not etched in a $Cl_2$ atmosphere, rugged surface of Pt and PZT are not transcribed to the $RuO_2$ film. The etch stop layer of $RuO_2$ is etched by $Cl_2/O_2$ gas. In this instance, since the $Cl_2/O_2$ gas almost does not etch polysilicon, a rugged surface of $RuO_2$ is not transcribed to the polysilicon. Lastly, the polysilicon and the gate oxide are etched by employing an etching method generally used in a semiconductor device fabrication process. If the etch stop layer is formed of $TiO_2$, the etch mask is formed of Ti, Ti is etched by $Cl_2/N_2$ gas, and both the upper Pt and PZT and the lower Pt are etched by $Cl_2/O_2$ gas. In this instance, since $TiO_2$ is almost not etched in the $Cl_2/O_2$ gas, rugged surfaces of the Pt and PZT are not transcribed to the $TiO_2$ film. And, the etch stop layer of $TiO_2$ is etched by $C_2F_6(C_3F_8$ or $CHF_3)$/Ar, and the polysilicon and the gate oxide are etched by an etching method similar to a method for fabricating a semiconductor device. In this instance, as $Cl_2$ gas and the like is used as the etch gas, though the mask of Ti is etched in etching the etch stop layer of $TiO_2$ or polysilicon, but the polysilicon and the gate oxide can be etched because the upper Pt serves as an etch mask. After the en bloc etching, as shown in FIG. 3G, P or As are implanted in the substrate 1 by ion injection, and subjected to heat treatment at an elevated temperature over approx. 650° C., to form source/drain 10. Finally by defining a capacitor of each cell by en bloc etching of the upper electrode 8 and the ferroelectric layer 7, the ferroelectric memory is fabricated.

Figure 4A:
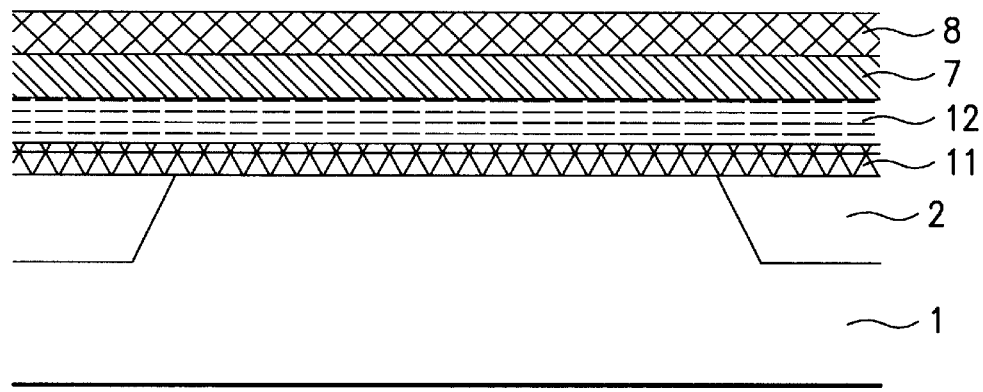
FIGS. 4A–4C illustrate sections showing the steps of a method for fabricating an MFMIS ferroelectric memory formed by using an etch stop layer of $RuO_2$; and, FIGS. 5A–5C illustrate sections showing the steps of a method for fabricating an MFIS ferroelectric memory formed by using an etch stop layer of $TiO_2$.
Figure 4B:
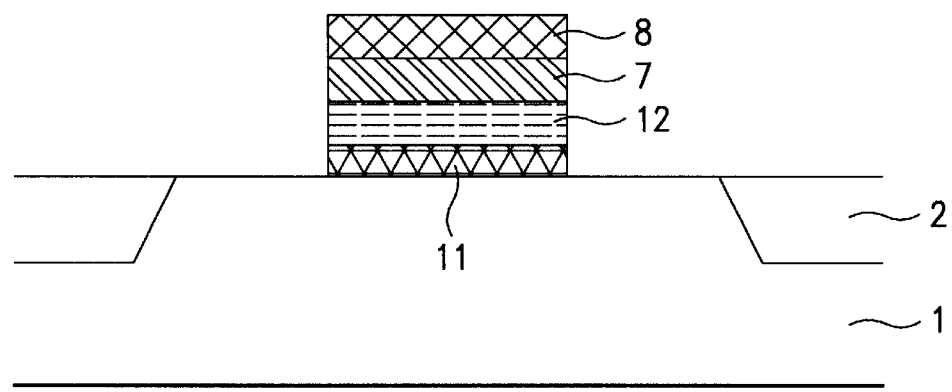
Figure 4C:
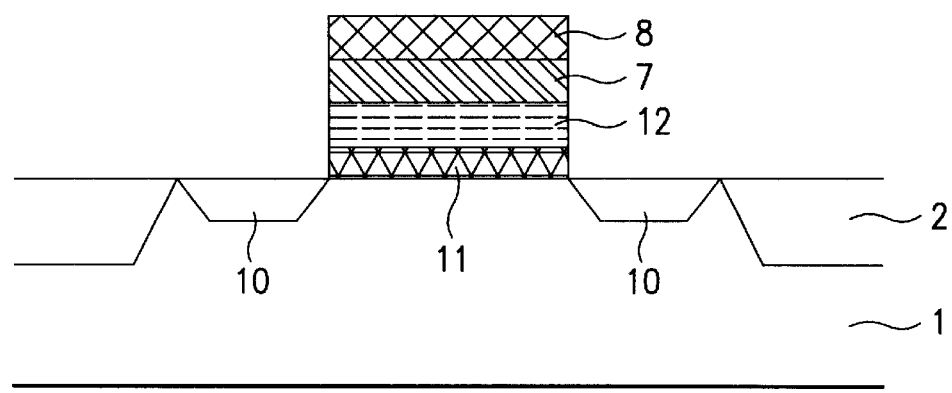

The en bloc etching by using the etch stop layer and the metal hard mask of the present invention is applicable, not only to a fabrication of the SWL ferroelectric memory, but also to 1 transistor type ferroelectric memory similar to the SWL ferroelectric memory. Since the 1 transistor type ferroelectric memory has advantages in that the 1 transistor type ferroelectric memory has a structure simpler than the 1 transistor/1 capacitor type ferroelectric memory, and is favorable for fabrication of a device with a high device packing density, and no data is broken during data reading, the 1 transistor type ferroelectric memory has been widely studied as a next generation ferroelectric memory with a high device packing density. In typical structures of the 1 transistor type ferroelectric memory, there are MFMIS (Metal Ferroelectric Metal Insulator Silicon) and MFIS (Metal Ferroelectric Insulator Silicon), which are very similar to a sectional structure of the SWL ferroelectric memory. In this case too, in order to fabricate devices with high device packing densities, it is effective to subject the ferroelectric capacitor and the insulator to an en bloc etching before formation of the source/drain. However, there is a problem of over etching of the silicon substrate. Therefore, it is necessary to form a film, taking etching into consideration starting from an initial film deposition. The present invention discloses a structure in which both the lower electrode and the etch stop layer are formed of $RuO_2$, and a structure in which both the insulating layer and the etch stop layer are formed of $TiO_2$. FIGS. 4A–4C illustrate sections showing the steps of a method for fabricating an MFMIS ferroelectric memory formed by using an etch stop layer of $RuO_2$.

Referring to FIG. 4A, a gate oxide layer 11 of $SiO_2$ or $CeO_2$ is formed on a silicon substrate 1 having a field oxide formed therein for isolation of cells, and, on the gate oxide layer 11, a layer of $RuO_2$ or a material containing the same is formed for use as a lower electrode and an etch stop layer 12 of a ferroelectric capacitor. A layer of Pt may be formed on the $RuO_2$ layer to use a multi-layered electrode, if the case demands. Then, a ferroelectric layer 7 and the upper electrode 8 may be formed on the etch stop layer 12, and, as explained, an etch mask of Ru or Cr is used in subjecting the upper electrode 8, the ferroelectric layer 7, the etch stop layer 12, and the gate oxide 11 to en bloc etching. Steps of a fabrication process hereafter are identical to the steps of the method for fabricating the SWL ferroelectric memory.

Figure 5A:
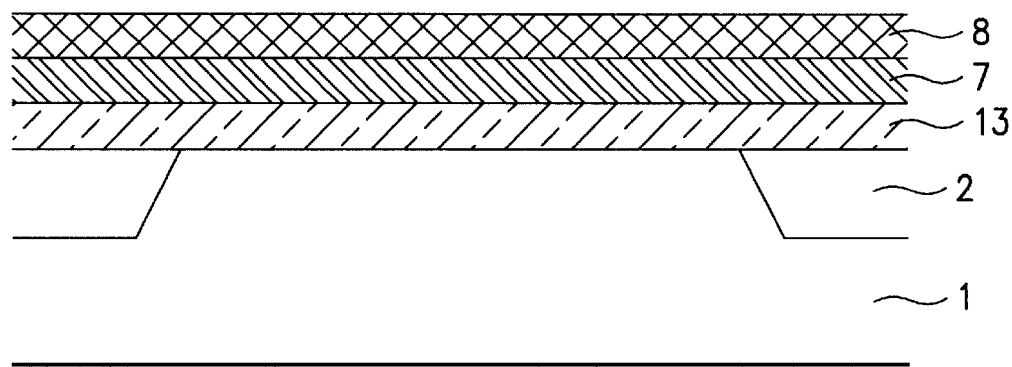
Figure 5B:
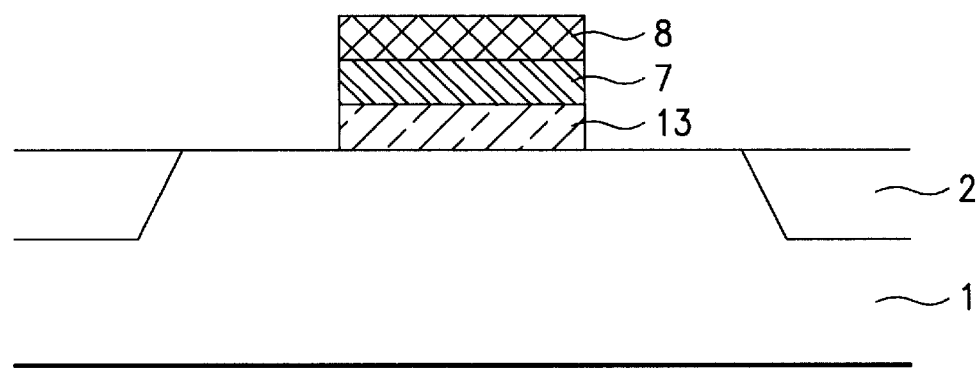
Figure 5C:
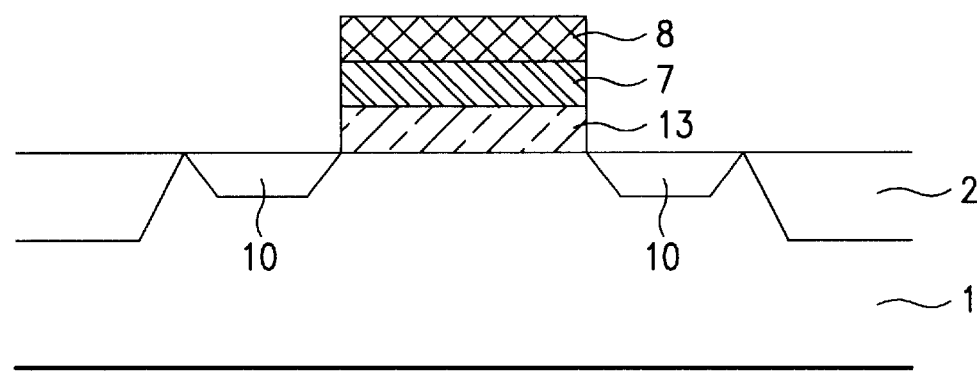

FIGS. 5A–5C illustrate sections showing the steps of a method for fabricating an MFIS ferroelectric memory formed by using an etch stop layer of $TiO_2$. Since no lower electrode is required in this case, a layer of $TiO_2$ for use as an etch stop layer 13 and the insulating layer is formed on a silicon substrate 1 directly, and a ferroelectric layer 7 and an upper electrode 8 are formed thereon in succession. A thin layer of $SiO_2$ which has an excellent interface characteristic may be formed before deposition of $TiO_2$, and the etch stop layer of $TiO_2$ may be omitted for simplifying the fabrication process and stabilization of characteristics, even if an etch stop characteristic becomes poor, as the case demands. Multi-layered film formed thus is subjected to en bloc etching by using the etch mask of Ti. In the etching, over etching of the silicon substrate can be prevented by using an etch stop characteristic of the $TiO_2$. The fabrication process hereafter is identical to the fabrication process of the SWL ferroelectric memory. Thus, by using a layer of $RuO_2$ or $TiO_2$ which serves as the etch stop layer as an electrode or a gate oxide layer, over etching of the silicon substrate can be prevented, and by using Ru, Cr, or Ti which has an excellent etch selectivity, a thick multi-layered film can also be etched.

As has been explained, the method for fabricating a nonvolatile ferroelectric memory of the present invention has the following advantages.

First, the en bloc etching of the ferroelectric capacitor and the polysilicon wordline by using one mask, not only permits to simplify the fabrication process, but also minimizes an alignment allowance which can occur when the polysilicon layer and the ferroelectric capacitor are respectively defined.

Second, the use of the etch stop layer of $RuO_2$ or $TiO_2$ in the en bloc etching of the ferroelectric capacitor and the polysilicon layer can prevent over etching of the silicon substrate.

Third, by using Ru, Cr, or Ti, which have excellent etch selectivity, the ferroelectric capacitor and the polysilicon layer can be en bloc etched.

Fourth, not only the over etching of the silicon substrate can be prevented by using $RuO_2$ or $TiO_2$ in fabrication of MFMIS or MFIS ferroelectric memory, but also the MFMIS or MFIS structure can be en bloc etched by using etch mask of Ru, Cr, and Ti.

It will be apparent to those skilled in the art that various modifications and variations can be made in the method for fabricating a nonvolatile ferroelectric memory of the present invention without departing from the spirit or scope of the invention. Thus, it is intended that the present invention cover the modifications and variations of this invention provided they come within the scope of the appended claims and their equivalents.

What is claimed is:

1. A method for fabricating a nonvolatile ferroelectric memory, comprising:

forming an insulating layer on a substrate;

forming a semiconductor layer on the insulating layer;

forming an etch stop layer on the semiconductor layer;

forming a lower electrode on the etch stop layer;

forming a ferroelectric layer on the lower electrode; and forming an upper electrode on the ferroelectric layer;

forming an etch mask pattern of a required form on the upper electrode;

using the etch mask pattern as a mask in subjecting the upper electrode, the ferroelectric layer, the lower electrode, the etch stop layer, the semiconductor layer, and the insulating layer to en bloc etching, to expose the substrate; and removing the etch mask pattern, and forming source/drain regions in the exposed substrate.

2. A method as claimed in claim 1, further comprising defining a capacitor region by en bloc etching of the upper electrode and the ferroelectric layer in a required region.

3. The method as claimed in claim 1, wherein the insulating layer comprises $SiO_2$, and the semiconductor layer comprises polycrystalline silicon or tungsten silicide.

4. A method as claimed in claim 1, wherein the etch stop layer comprises $TiO_2$, $RuO_2$, or a material containing $TiO_2$, or $RuO_2$.

5. A method as claimed in claim 1, wherein the etch mask pattern comprises Ru, Cr or Ti.

6. A method as claimed in claim 5, wherein the etch stop layer comprises $RuO_2$, and the etch mask comprises Ru or Cr wherein the Ru or Cr etch mask is etched by using an etch mask of Ti.

7. A method as claimed in claim 1, wherein an etch mask gas for the etch mask comprises $Cl_2/O_2$ or $Cl_2/N_2$, and an etch gas for the etch stop layer is $Cl_2/O_2$, or $C_2F_6(C_3F_8$ or $CHF_3)/Ar$.

8. A method as claimed in claim 1, wherein the upper electrode, the ferroelectric layer, and the lower electrode are either en bloc etched by $Cl_2/O_2$ gas, or etched by $Cl_2$, $Cl_2/CF_4$, and $Cl_2$ gases, respectively.

9. A method for fabricating a nonvolatile ferroelectric memory, comprising:
   forming an etch stop layer;
   forming a ferroelectric layer on the etch stop layer;
   forming an electrode layer on the ferroelectric layer;
   forming an etch mask pattern comprising Ru, Cr or Ti of a required form on the electrode layer;
   using the etch mask pattern as a mask in subjecting the electrode layer, the ferroelectric layer, and the etch stop layer to en bloc etching, to expose the substrate; and
   removing the etch mask pattern, and forming source/drain regions in the exposed substrate.

10. A method as claimed in claim 9, further comprising forming an insulating layer between the substrate and the etch stop layer.

11. A method as claimed in claim 9, wherein the etch stop layer comprises $TiO_2$, $RuO_2$, or a material containing $TiO_2$, or $RuO_2$.

12. A method as claimed in claim 9, wherein an etch gas for the etch mask comprises $Cl_2/O_2$ or $Cl_2/N_2$, and an etch gas for the etch stop layer comprises $Cl_2/O_2$, or $C_2F_6(C_3F_8$ or $CHF_3)/Ar$.

13. A method as claimed in claim 9, wherein the electrode layer, and the ferroelectric layer are either en bloc etched by $Cl_2/O_2$ gas, or etched by $Cl_2$ and $Cl_2/CF_4$ gases, respectively.

14. The method as claimed in claim 1, wherein the lower electrode comprises Pt/Ti or $IrO_2$.

15. The method as claimed in claim 1, wherein the ferroelectric layer comprises PZT or SBT.

16. The method as claimed in claim 1, wherein the upper electrode comprises Pt or $IrO_2$.

17. The method as claimed in claim 1 1, wherein the insulating layer comprises $SiO_2$.

18. The method as claimed in claim 9, wherein the ferroelectric layer comprises PZT or SBT.

19. The method as claimed in claim 9, wherein the electrode layer comprises Pt or $IrO_2$.

20. A method for fabricating a nonvolatile ferroelectric memory, comprising:
   forming an insulating layer on a substrate, wherein the insulating layer comprises $SiO_2$;
   forming a semiconductor layer on the insulating layer, wherein the semiconductor layer comprises polysilicon or tungsten silicide;
   forming an etch stop layer on the semiconductor layer, wherein the etch stop layer comprises $RuO_2$ or $TiO_2$;
   forming a lower electrode on the etch stop layer, wherein the lower electrode comprises Pt/Ti or $IrO_2$;
   forming a ferroelectric layer on the lower electrode, wherein the ferroelectric layer comprises PZT or SBT;
   forming an upper electrode on the ferroelectric layer, wherein the upper electrode comprises Pt or $IrO_2$;
   forming an etch mask pattern of a required form on the upper electrode, wherein the etch mask pattern comprises Ti, Ru or Cr;
   using the etch mask pattern as a mask in subjecting the upper electrode, the ferroelectric layer, the lower electrode, the etch stop layer, the semiconductor layer, and the insulating layer to en bloc etching, to expose the substrate; and
   removing the etch mask pattern, and forming source/drain regions in the exposed substrate.

21. The method as claimed in claim 20, wherein the etch stop layer comprises $RuO_2$ and the etch mask pattern comprises Ru or Cr.

22. The method as claimed in claim 20, wherein the etch stop layer comprises $TiO_2$ and the etch mask pattern comprises Ti.

23. A method for fabricating a nonvolatile ferroelectric memory, comprising:
   forming an insulating layer on a substrate, wherein the insulating layer comprises $SiO_2$;
   forming an etch stop layer on the insulating layer, wherein the etch stop layer comprises $RuO_2$ or $TiO_2$;
   forming a ferroelectric layer on the etch stop layer, wherein the ferroelectric layer comprises PZT or SBT;
   forming an electrode layer on the ferroelectric layer, wherein the electrode layer comprises Pt or $IrO_2$;
   forming an etch mask pattern of a required form on the electrode layer, wherein the etch mask pattern comprises Ti, Ru or Cr;
   using the etch mask pattern as a mask in subjecting the electrode layer, the ferroelectric layer, and the etch stop layer to en bloc etching, to expose the substrate; and
   removing the etch mask pattern, and forming source/drain regions in the exposed substrate.

24. The method as claimed in claim 23, wherein the etch stop layer comprises $RuO_2$ and the etch mask pattern comprises Ru or Cr.

25. A method for fabricating a nonvolatile ferroelectric memory, comprising:
   forming an etch stop layer on a substrate, wherein the etch stop layer comprises $RuO_2$ or $TiO_2$;
   forming a ferroelectric layer on the etch stop layer, wherein the ferroelectric layer comprises PZT or SBT;
   forming an electrode layer on the ferroelectric layer, wherein the electrode layer comprises Pt or $IrO_2$;
   forming an etch mask pattern of a required form on the electrode layer, wherein the etch mask pattern comprises Ti, Ru or Cr;
   using the etch mask pattern as a mask in subjecting the electrode layer, the ferroelectric layer, and the etch stop layer to en bloc etching, to expose the substrate; and,
   removing the etch mask pattern, and forming source/drain regions in the exposed substrate.

26. The method as claimed in claim 25, wherein the etch stop layer comprises $TiO_2$ and the etch mask pattern comprises Ti.

* * * * *